United States Patent
Komatsuda

(10) Patent No.: US 9,760,012 B2
(45) Date of Patent: Sep. 12, 2017

(54) ILLUMINATION DEVICE

(75) Inventor: Hideki Komatsuda, Ageo (JP)

(73) Assignee: NIKON CORPORATION, Tokyo (JP)

( * ) Notice: Subject to any disclaimer, the term of this patent is extended or adjusted under 35 U.S.C. 154(b) by 538 days.

(21) Appl. No.: 14/236,742

(22) PCT Filed: Jul. 31, 2012

(86) PCT No.: PCT/JP2012/069465
§ 371 (c)(1),
(2), (4) Date: Mar. 24, 2014

(87) PCT Pub. No.: WO2013/018799
PCT Pub. Date: Feb. 7, 2013

(65) Prior Publication Data
US 2014/0218705 A1   Aug. 7, 2014

(30) Foreign Application Priority Data

Aug. 4, 2011  (JP) .................................. 2011-170626

(51) Int. Cl.
*G03F 7/20* (2006.01)
(52) U.S. Cl.
CPC ...... *G03F 7/70191* (2013.01); *G03F 7/70058* (2013.01); *G03F 7/70075* (2013.01); *G03F 7/70091* (2013.01)
(58) Field of Classification Search
CPC ............. G03F 7/70075; G03F 7/70091; G03F 7/70191; G03F 7/70058
See application file for complete search history.

(56) References Cited

U.S. PATENT DOCUMENTS

| 5,459,547 | A | 10/1995 | Shiozawa | |
|---|---|---|---|---|
| 6,049,374 | A | 4/2000 | Komatsuda et al. | |
| 6,807,022 | B1 * | 10/2004 | Yanowitz | G02B 26/0875 359/819 |
| 7,423,731 | B2 | 9/2008 | Tanitsu et al. | |
| 8,587,764 | B2 | 11/2013 | Kita | |
| 2005/0200820 | A1 * | 9/2005 | Gui | G03F 7/70291 355/67 |
| 2006/0170901 | A1 | 8/2006 | Tanitsu et al. | |
| 2007/0146676 | A1 | 6/2007 | Tanitsu et al. | |
| 2008/0225256 | A1 * | 9/2008 | Kita | G02B 27/0927 355/67 |
| 2008/0225257 | A1 | 9/2008 | Kita | |

OTHER PUBLICATIONS

International Preliminary Report on Patentability issued in International Application No. PCT/JP2012/069465 on Feb. 4, 2014.

* cited by examiner

*Primary Examiner* — Michelle M Iacoletti
(74) *Attorney, Agent, or Firm* — Oliff PLC

(57) ABSTRACT

An illumination optical system that illuminates a target surface includes a first deflector, a second deflector, and an optical integrator. The first deflector is arranged on a first face crossing an optical path of light from a light source and has a period in a first direction defined on the first face. The second deflector is arranged on a second face crossing an optical path of light from the first deflector and has a period in a second direction defined on the second face. The optical integrator has a plurality of wavefront division facets arrayed on a third face crossing an optical axis of light from the second deflector. At least one of the first and second deflectors rotates about an optical axis of the illumination optical system or about an axis parallel to the optical axis in order to adjust a pattern of an illumination distribution.

12 Claims, 14 Drawing Sheets

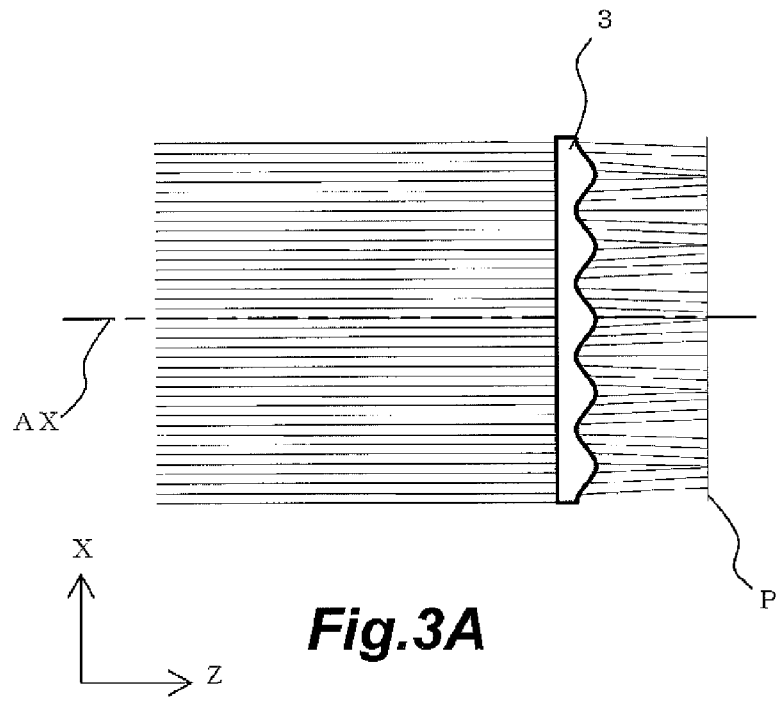
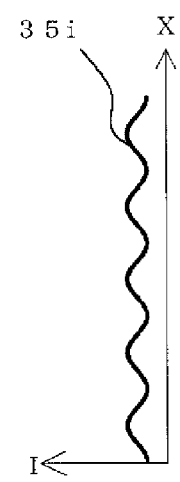
Fig.3A  Fig.3B
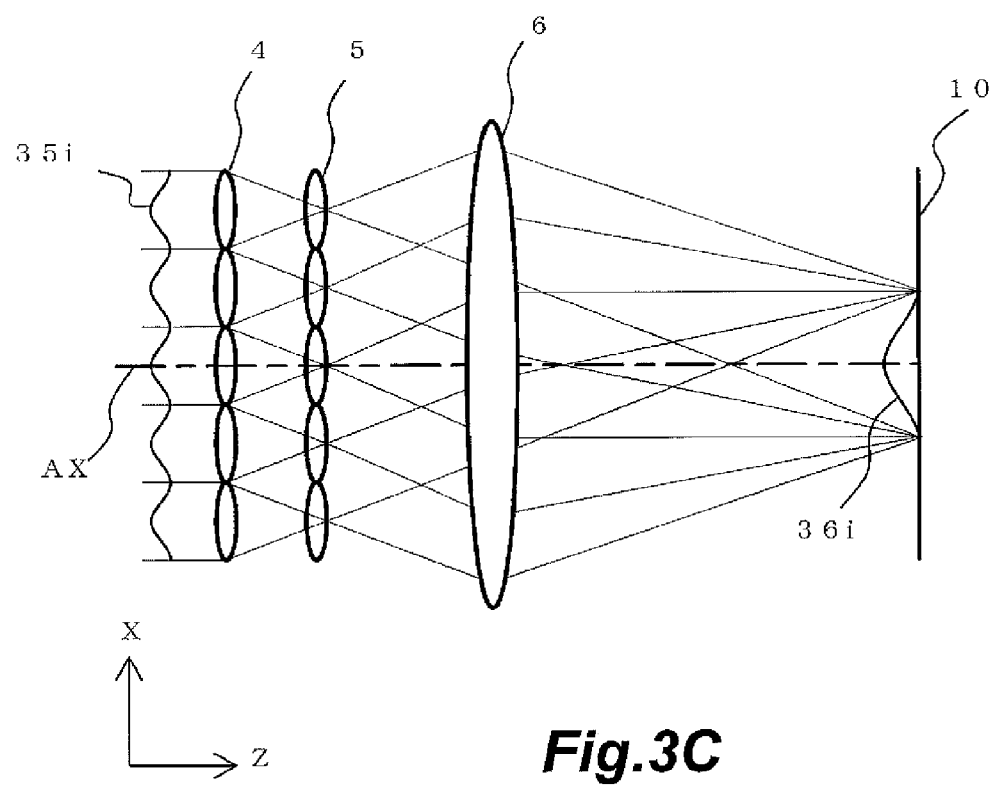
Fig.3C

ILLUMINATION DEVICE

TECHNICAL FIELD

The present embodiment relates to an illumination apparatus for illuminating an object. Particularly, it relates to an illumination apparatus which is applied to exposure apparatus used in a lithography process for manufacturing devices such as semiconductor devices and liquid crystal display devices, so as to illuminate a projection master.

BACKGROUND ART

A conventionally known illumination apparatus applied to projection exposure apparatus is one using a fly's eye lens as optical integrator. The illumination apparatus with the fly's eye lens arranged therein illuminates the projection master with light in a state in which light beams from secondary light sources formed by respective wavefront division facets of the fly's eye lens are superimposed. For illuminating the projection master with light having a uniform illuminance distribution, there is a known illumination apparatus provided with a correction optical system for correcting an illuminance distribution of a beam entering the fly's eye lens (e.g., cf. Patent Literature 1).

The illumination apparatus of Patent Literature 1 is configured as follows: when the illuminance distribution of the light illuminating the projection master is different in a central region or in a peripheral region of the projection master from the other and when angular intensity distributions of focused beams are different from each other depending upon positions on the projection master, the correction optical system is located between a light source and the fly's eye lens to change illuminance distributions of beams incident into the respective wavefront division facets of the fly's eye lens so as to correct nonuniform angular distributions made in apertures of respective beams focused on the projection master, thereby obtaining a uniform illuminance distribution.

CITATION LIST

Patent Literature

Patent Literature 1: U.S. Pat. No. 6,049,374

SUMMARY OF INVENTION

Technical Problem

However, the illumination apparatus described in Patent Literature 1 had the problem that the arrangement of the correction optical system such as a filter caused absorption of the illumination light, resulting in a loss of light quantity.

The present embodiment has, been accomplished in view of the above problem and it is an object thereof to provide an illumination apparatus achieving illumination with a uniform light intensity distribution or illumination with a desired light intensity distribution, while reducing the light quantity loss.

Solution to Problem

In order to solve the above problem, an illumination apparatus according to the first aspect of the present embodiment is an illumination apparatus for illuminating an illumination target surface, comprising: a deflection member arranged in an optical path of the illumination apparatus and configured to form an illuminance distribution with a periodic pattern along a predetermined direction on a predetermined face traversing the optical path; and an optical integrator system having a plurality of wavefront division facets arrayed on the predetermined face and configured to form secondary light sources with use of a beam from the deflection member, wherein the deflection member forms the illuminance distribution with the periodic pattern of an integer times or a unit fraction times an array period of the plurality of wavefront division facets.

An illumination apparatus according to the second aspect of the present embodiment is an illumination apparatus for illuminating an illumination target surface, comprising: a deflection member arranged in an optical path of the illumination apparatus and configured to form an illuminance distribution with a periodic pattern along a predetermined direction on a predetermined face traversing the optical path; and an optical integrator system having a plurality of wavefront division facets arrayed on the predetermined face and configured to form secondary light sources with use of a beam from the deflection member, wherein the deflection member is configured so as to be adjustable in position, for changing the periodic pattern.

A projection exposure device according to the third aspect of the present embodiment comprises: the illumination apparatus according to the first or second aspect; and a projection optical system for projecting light from the illumination target surface onto a projection target surface.

An illumination method according to the fourth aspect of the present embodiment comprises: deflecting an incident beam to form an illuminance distribution with a periodic pattern on a predetermined face; guiding the deflected beam to a plurality of wavefront division facets arrayed on the predetermined face, to form secondary light sources; and illuminating an illumination target surface with use of beams from the secondary light sources, wherein the periodic pattern is of an integer times or a unit fraction times an array period of the wavefront division facets in a direction along the wavefront division facets.

An illumination method according to the fifth aspect of the present embodiment comprises: deflecting an incident beam to form an illuminance distribution with a periodic pattern on a predetermined face; guiding the deflected beam to a plurality of wavefront division facets arrayed on the predetermined face, to form secondary light sources; changing the periodic pattern of the illuminance distribution formed on the predetermined face; and illuminating an illumination target surface with use of beams from the secondary light sources.

An exposure method according to the sixth aspect of the present embodiment comprises: illuminating a predetermined pattern located on an illumination target surface, with light from a light source; and exposing a photosensitive substrate to light having passed via the predetermined pattern, wherein the mentioned illuminating comprises illuminating the predetermined pattern located on the illumination target surface, by using the illumination method according to the fourth or fifth aspect.

A device manufacturing method according to the seventh aspect of the present embodiment is a device manufacturing method comprising: performing exposure to transfer an exposure pattern onto the photosensitive substrate, using the exposure method according to the sixth aspect; developing the photosensitive substrate onto which the exposure pattern has been transferred, to form a mask layer in a shape corresponding to the exposure pattern on a surface of the photosensitive substrate; and processing the surface of the photosensitive substrate through the mask layer.

Advantageous Effect of Invention

The present embodiment can realize the illumination apparatus achieving illumination with a uniform light intensity distribution or illumination with a desired light intensity distribution, while reducing the light quantity loss.

BRIEF DESCRIPTION OF DRAWINGS

FIGS. 3A to 3C are drawings showing the function of the deflection member according to the first embodiment.

DESCRIPTION OF EMBODIMENTS

Embodiments will be described below based on the drawings.

Figure 1:
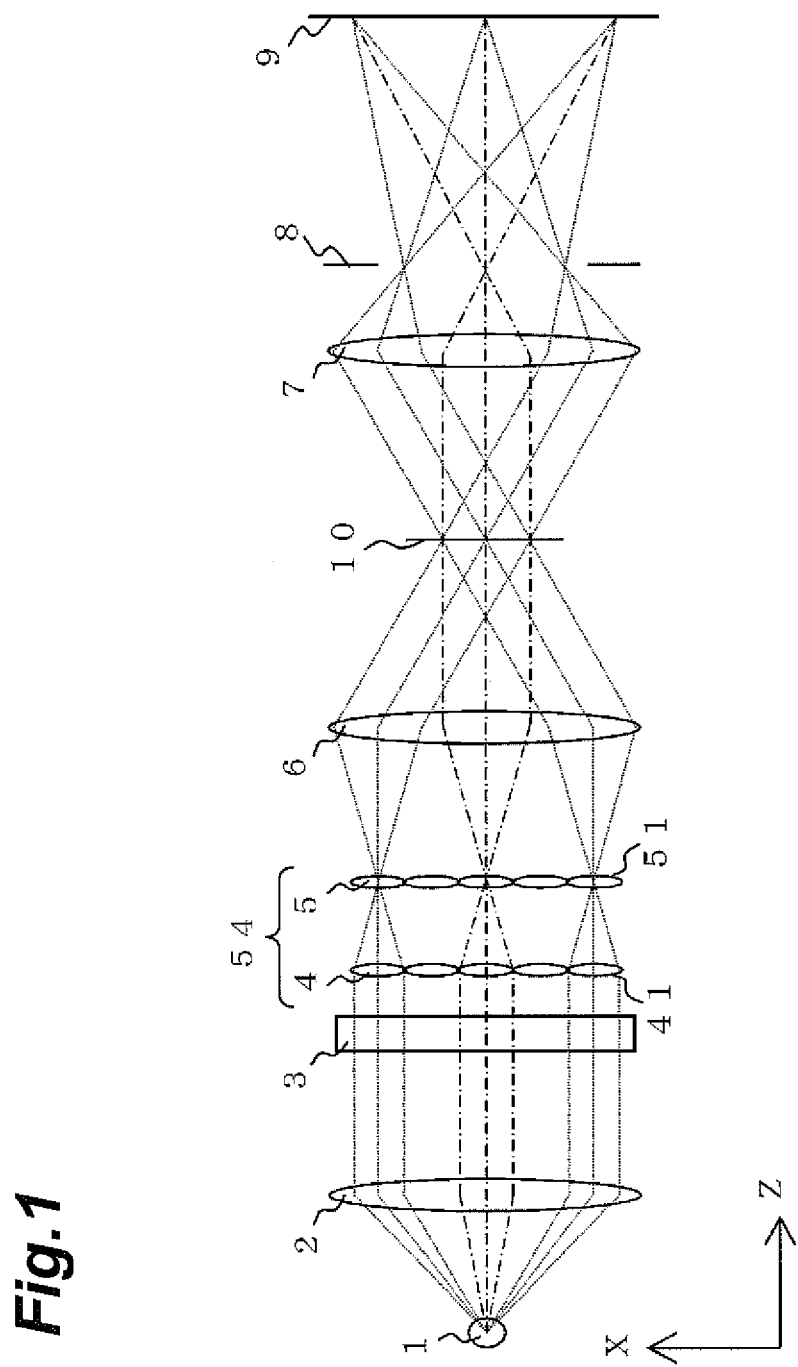
FIG. 1 is a drawing showing a projection exposure device equipped with an illumination apparatus according to the first embodiment.

FIG. 1 shows a projection optical device equipped with an illumination apparatus according to the first embodiment. In FIG. 1, Z-axis is set along a direction of a normal to a projection target surface 9 on which a wafer being a photosensitive substrate is arranged, X-axis along a direction parallel to the plane of FIG. 1 in the projection target surface 9, and Y-axis along a direction perpendicular to the plane of FIG. 1 in the projection target surface 9. With reference to FIG. 1, exposure light (illumination light) is supplied from a light source 1 in the projection exposure device of the present embodiment.

In FIG. 1, the light emitted from the light source 1 is converted into a nearly parallel beam by a collimator lens 2 to enter a deflection member 3. The configuration and function of the deflection member 3 will be described later.

The beam from the deflection member 3 is incident into a fly's eye lens system 54 composed of a first fly's eye lens 4 and a second fly's eye lens 5.

Figure 2B:
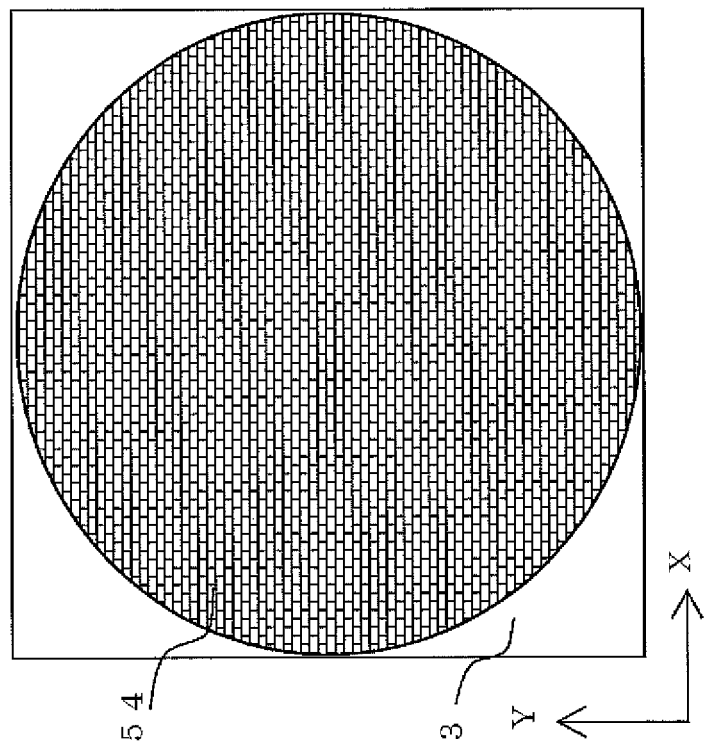
FIGS. 2A and 2B are drawings showing the arrangement of a deflection member according to the first embodiment.
Figure 2A:
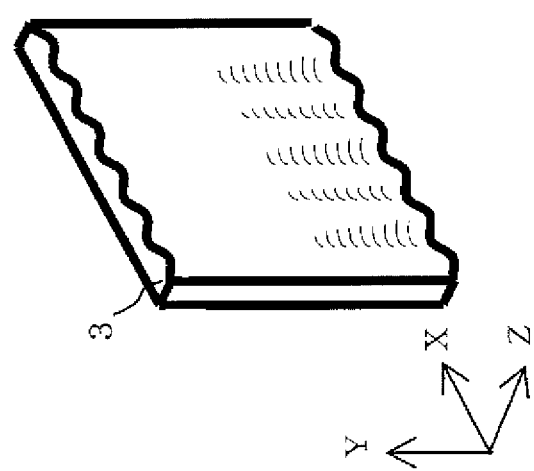

The first fly's eye lens 4 of the fly's eye lens system 54 has a plurality of lens facets arranged in a two-dimensional array pattern in a face traversing the traveling direction of the incident beam (which is the XY plane in the present embodiment). The beam incident onto an entrance face 41 of the first fly's eye lens 4 is two-dimensionally wavefront-divided into microscopic units by the plurality of lens facets. The divided beams in microscopic units are focused each around an exit face 51 of the second fly's eye lens 5 to form a plurality of secondary light sources. In the present specification, a facet necessary for forming one of the secondary light sources will be referred to as a wavefront division facet. It is usually the case that a fly's eye lens consists of an array of many wavefront division facets, and FIGS. 1, 2A and 2B show the fly's eye lenses each having five wavefront division facets, for simplicity.

The beams from the secondary light sources are condensed by a condenser lens 6 to Kohler-illuminate an illumination target surface 10. On the illumination target surface 10 there is a reticle or the like arranged as a projection master having a pattern to be projected onto the projection target surface 9.

The beams from the illumination target surface 10 are condensed by a projection optical system 7 to be projected onto the projection target surface 9. An aperture stop 8 of the projection optical system 7 is arranged at a position conjugate with the position where the secondary light sources are formed.

Next, the deflection member 3 shown in FIG. 1 will be described in detail with reference to FIGS. 2A to 3C. In FIG. 2A, the deflection member 3 is a plate made of a material transparent to the exposure light, in which an entrance face is a flat face and an exit face has a sinusoidal shape in one direction.

FIG. 2B is a drawing showing an arrangement relationship between the deflection member 3 and the fly's eye lens system 54, and, as shown in this FIG. 2B, the deflection member 3 has the size enough to include an effective area of the first fly's eye lens 4 in the fly's eye lens system 54, when viewed from the traveling direction side of the light (or when viewed from the Z-direction side).

FIG. 3A is an optical path diagram for explaining the function of the deflection member 3. As shown in FIG. 3A, for example, when a parallel beam that can be represented by a large number of rays is incident from the left in the drawing into the deflection member 3, refraction (light deflection action) on the exit face of the deflection member 3 produces a density difference of rays emitted from the deflection member 3. Since densities of rays correspond to optical energy densities, an illuminance distribution (light intensity distribution) formed on an imaginary plane P on the exit side of the deflection member 3 is one having the period in the X-direction with a high intensity at positions corresponding to crests and a low intensity at positions corresponding to troughs in the sinusoidal shape of the deflection member 3.

The illuminance distribution 35$i$ on the imaginary plane P is shown in FIG. 3B. When a unit period of the deflection member 3 is assumed to be one period of a sine wave, as long as the imaginary plane P and the deflection member 3 are located in proximity, the illuminance distribution 35$i$ formed on the imaginary plane P is one in which the intensity varies in the X-direction in the period approximately equal to the unit period of the deflection member 3.

FIG. 3C is a drawing showing a relation between the illuminance distribution with the periodic pattern formed by the deflection member 3 and an illuminance distribution on the illumination target surface 10, in an initial state of the position of the deflection member 3 in the XY plane. The description hereinafter will be given on the assumption that the entrance face of the first fly's eye lens 4 is located at the position of the foregoing imaginary plane P. As shown in this FIG. 3C, when the period of the illuminance distribution 35$i$ formed by the deflection member 3 is equal to the array period of the wavefront division facets of the first fly's eye lens 4, illuminance distributions with the same property are superimposed on the illumination target surface 10 through the condenser lens 6 and therefore an illuminance distribution 36$i$ formed on the illumination target surface 10 is one with the same property as an illuminance distribution in one period of the light intensity distribution 35$i$.

By moving the deflection member 3 along the optical axis AX of the illumination apparatus, we can adjust the periodic pattern of the illuminance distribution formed by the deflection member 3; typically, we can control a difference between a maximum value and a minimum value of the illuminance distribution and, in turn, we can control projection and depression components of the illuminance distribution on the illumination target surface 10. Furthermore, the illuminance distribution on the illumination target surface 10 may be controlled by moving the deflection member 3 along the pitch direction (X-direction) of the deflection member 3 out of directions perpendicular to the optical axis AX.

If an illuminance distribution of an inverse tendency to a nonuniform illuminance distribution on the illumination target surface 10 is produced by the deflection member 3, the nonuniform illuminance distribution on the illumination target surface 10 can be made closer to a uniform illuminance distribution.

In the above description, the illuminance distribution formed on the entrance face 41 of the first fly's eye lens 4 was one having the same period as the array period of the wavefront division facets of the first fly's eye lens 4, i.e., one having the period equal to the array period, but the illuminance distribution to be formed on the entrance face of the first fly's eye lens 4 may be one with the periodic pattern of an integer times or a unit fraction times the array period of the wavefront division facets of the first fly's eye lens 4.

In the first embodiment, as described above, the deflection member forms the illuminance distribution of an integer (including one) times or a unit fraction times the array period of the plurality of wavefront division facets on the wavefront division facets, whereby an angular light intensity distribution of a beam focused at any position on the illumination target surface can be set to a desired distribution.

Figure 4A:
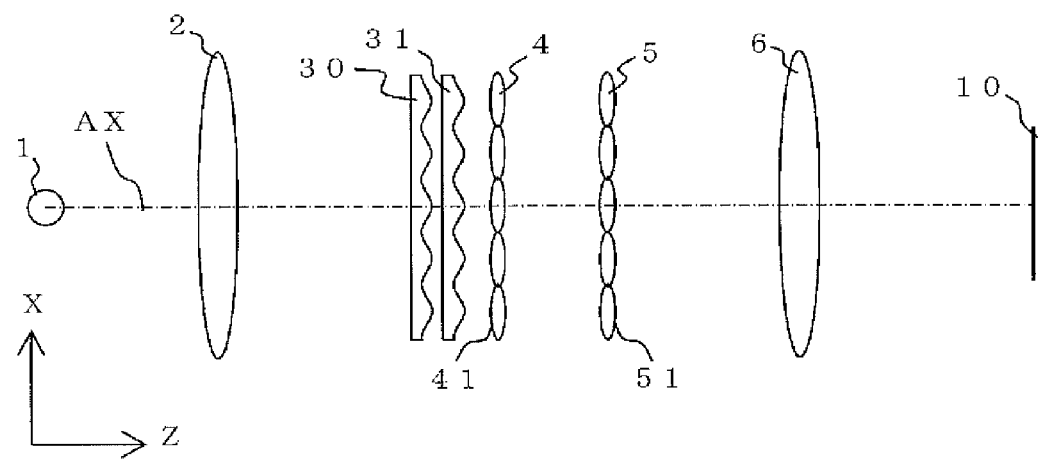
FIGS. 4A and 4B are drawings showing an illumination apparatus according to the second embodiment.
Figure 4B:
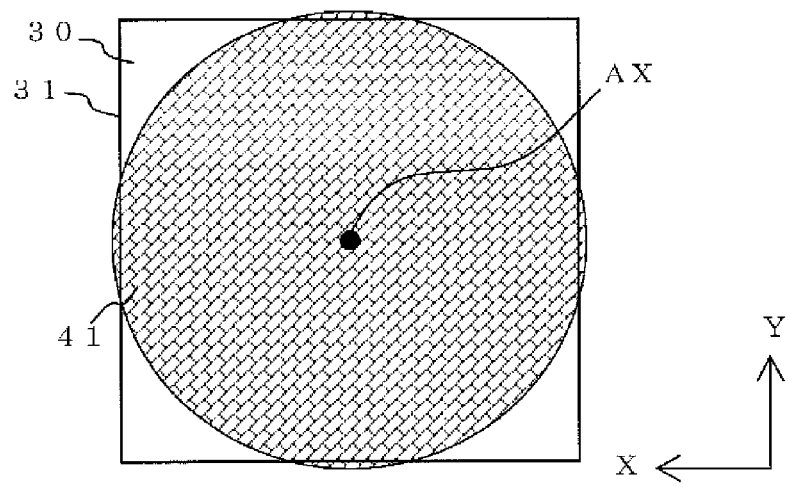

The above-described first embodiment concerned the configuration wherein one deflection member 3 was provided as correction optical system, but the number of deflection members does not have to be limited to one and may be two or more. The below will describe the second embodiment provided with a plurality of deflection members, with reference to FIGS. 4A-5B, 6, 7A-8D, 9-10, and 11A-11C. FIGS. 4A and 4B show the configuration of the illumination apparatus according to the second embodiment. In the description hereinafter, members with the same functionality as the members shown in FIGS. 1, and 2A-3C above will be denoted by the same reference signs.

The configuration in FIGS. 4A and 4B is different from the configuration shown in FIG. 1, in that a first deflection element 30 and a second deflection element 31 arrayed along the traveling direction of the illumination light are provided instead of the deflection member 3 which can be regarded as correction optical system. In FIG. 4A, a beam incident into the first deflection element 30 and the second deflection element 31 is converted into an illuminance distribution with a periodic pattern to enter the entrance face 41 of the first fly's eye lens 4. Here, FIG. 4B shows an arrangement relation between the first and second deflection elements 30, 31 and the entrance face 41 of the first fly's eye lens 4. As shown in this FIG. 4B, the first and second deflection elements 30, 31 have their respective exit faces of the same shape and are in an initial state in which the phases thereof are identical with each other.

Figure 5B:
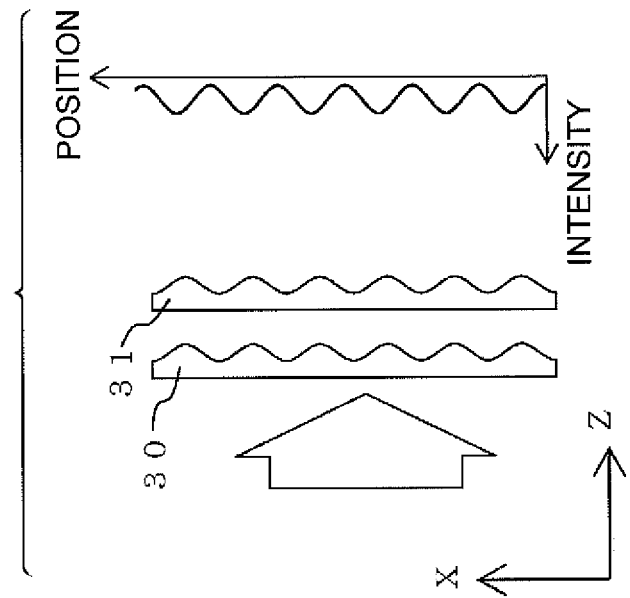
FIGS. 5A and 5B are drawings showing the function of first and second deflection elements.
Figure 5A:
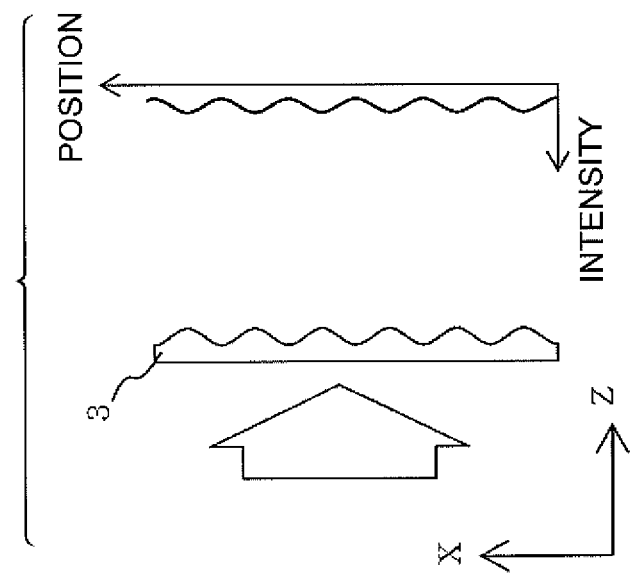

The function of the first and second deflection elements 30, 31 will be described below with reference to FIGS. 5A and 5B. FIG. 5A is a drawing showing the illuminance distribution formed on the exit side by the aforementioned deflection member 3, whereas FIG. 5B is a drawing showing the illuminance distribution formed on the exit side by the first and second deflection elements 30, 31. In FIGS. 5A and 5B, the arrow indicates the traveling direction of the light incident into the deflection member 3 or into the first deflection element 30 and the second deflection element 31. The graph shown on the right of the deflection member 3 or the first and second deflection elements 30, 31 shows the illuminance distribution with the periodic pattern resulting from deflection of the light by the deflection member 3 or by the first deflection element 30 and the second deflection element 31. In these graphs, the vertical axis represents the relative position to the deflection member 3 or to the second deflection element 31, and the horizontal axis the intensity of light.

The first deflection element 30 and the second deflection element 31 shown in FIG. 5B are configured so that the exit faces thereof have the same shape of a sinusoidal shape in one direction (X-direction). Since the first and second deflection elements 30, 31 are arranged so that the phases of the exit faces thereof are identical with each other, the illuminance distribution formed thereby is one with the periodic pattern including higher crests and deeper troughs than those in the case of the single deflection member 3 shown in FIG. 5A. In the initial state in which the first and second deflection elements 30, 31 are arranged so that the phases of the exit faces thereof are identical with each other, the illuminance distribution formed on the entrance face 41 of the first fly's eye lens 4 is one with the periodic pattern of an integer times or a unit fraction times the array period of the wavefront division facets of the first fly's eye lens 4.

At least one of the first and second deflection elements 30, 31 may be configured so as to be rotatable about the optical axis of the illumination apparatus or about an axis parallel to the optical axis. The description below will be given with reference to FIGS. 6, 7A-8D.

Figure 6:
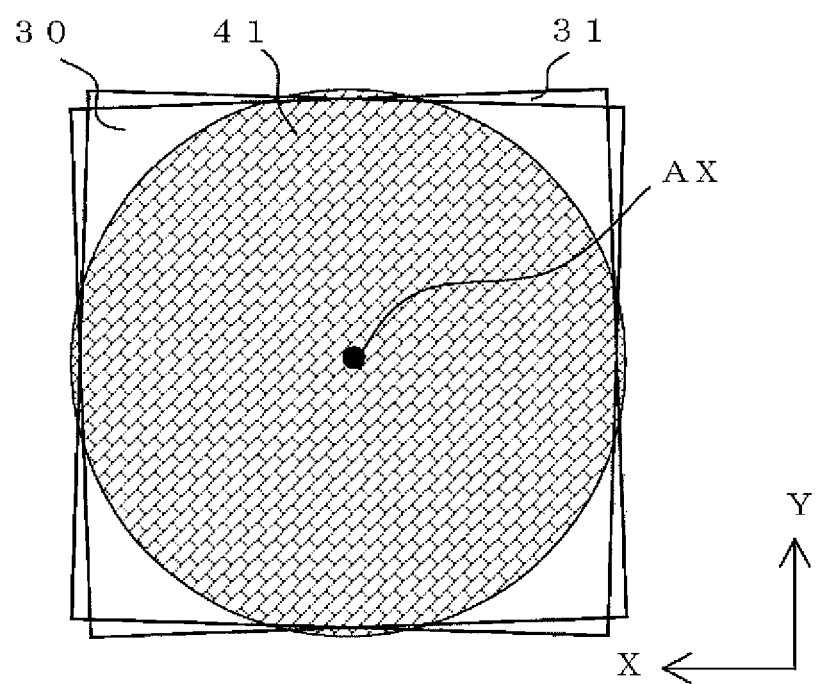
FIG. 6 is a drawing showing the arrangement of the first and second deflection elements.

FIG. 6 is a drawing showing a state of arrangement of the first deflection element 30 and the second deflection element 31, and the entrance face 41 of the first fly's eye lens 4. In FIG. 6, the first and second deflection elements 30, 31 are arranged in a state in which the first deflection element 30 is rotated clockwise and the second deflection element 31 is rotated counterclockwise about the optical axis AX of the illumination apparatus, from the state shown in FIG. 4B. As in the aforementioned example of FIGS. 4A-5B, the first deflection element 30 and the second deflection element 31 have the same period in the direction along each exit face. Furthermore, the periodic pattern of the illuminance distribution with the periodic pattern formed on the entrance face 41 of the first fly's eye lens 4 by the first deflection element 30 and the second deflection element 31 is the same as the array period of the wavefront division facets of the first fly's eye lens 4.

Figure 7A:
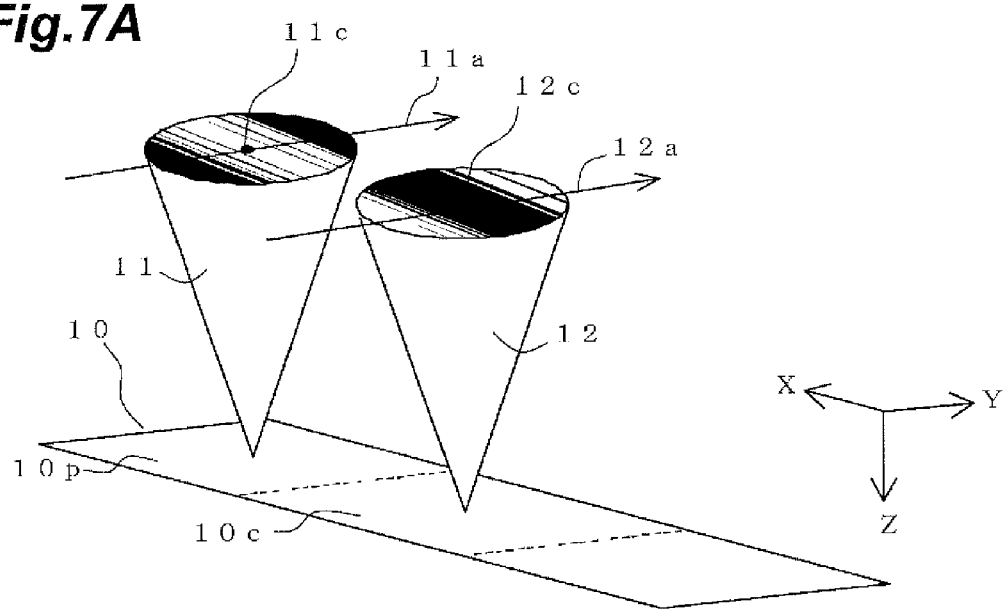
FIGS. 7A to 7C are drawings showing illuminance distributions of beams impinging on an illumination target surface without arrangement of the first and second deflection elements.

FIG. 7A shows a state of beams impinging on the illumination target surface 10 without arrangement of the first deflection element 30 and the second deflection element 31. In FIG. 7A, a central region 10c of the illumination target surface 10 and a peripheral region 10p thereof in the X-direction are separated by a dotted line along the Y-direction. When the origin 11c is defined at a center in an aperture of a beam 11 focused at the peripheral region 10p of the illumination target surface 10, FIG. 7B shows a light intensity distribution along an axis 11a extending in the Y-direction while passing the origin 11c; when the origin 12c is defined at a center in an aperture of a beam 12 focused at the central region 10c, FIG. 7C shows a light intensity distribution along an axis 12a extending in the Y-direction while passing the origin 12c.

Figure 7B:
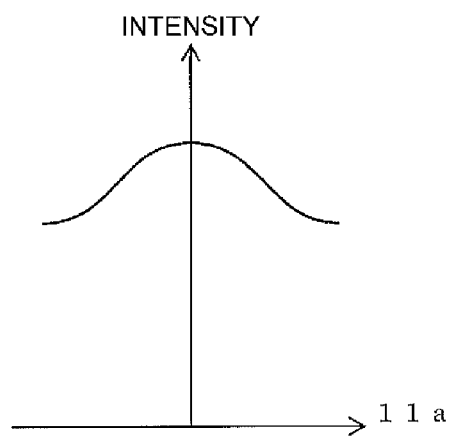
Figure 7C:
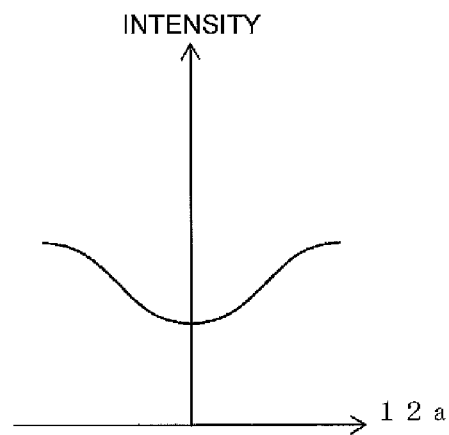

In the light intensity distributions shown in FIGS. 7B and 7C, the vertical axis represents the light intensity and the horizontal axis coordinates along each axis 11a, 12a. These light intensity distributions shown in FIGS. 7B and 7C correspond respectively to a light intensity distribution in angular directions with respect to a reference axis connecting the origin 11c and the focused point, of the beam 11 focused at the peripheral region 10p of the illumination target surface 10 and to a light intensity distribution in angular directions with respect to a reference axis connecting the origin 12c and the focused point, of the beam 12 focused at the central region 10c of the illumination target surface 10.

Now, the state of the first and second deflection elements 30, 31 shown in FIG. 6 is a state in which troughs of the first deflection element 30 and troughs of the second deflection element 31 different by one period are first superimposed at the ends of the first deflection element 30 and the second deflection element 31 in the Y-direction. As in this case, rotation of the first deflection element 30 and the second deflection element 31 leads to superposition of crests and crests and superposition of troughs and troughs of the same period of the first deflection element 30 and the second deflection element 31 around the centers of the first deflection element 30 and the second deflection element 31 in the Y-direction. Furthermore, it leads to superposition of crests and crests and superposition of troughs and troughs one period different at the ends of the first deflection element 30 and the second deflection element 31.

Figure 8A:
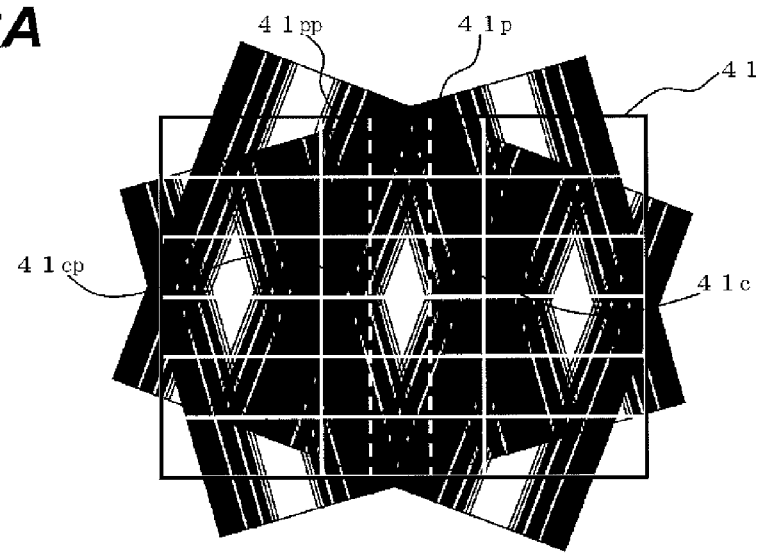
FIGS. 8A to 8D are drawings showing illuminance distributions of beams impinging on the illumination target surface by means of the first and second deflection elements.
Figure 8B:
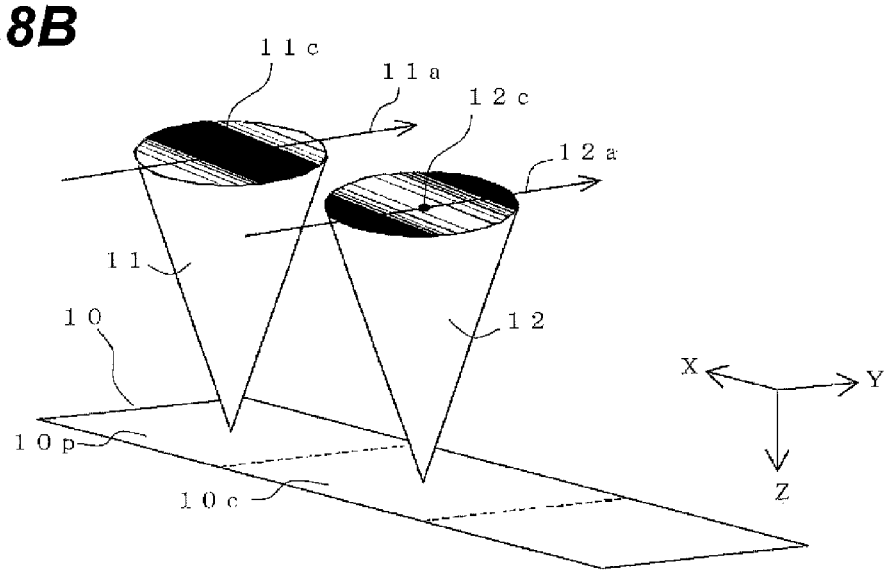

The period of an illuminance distribution newly produced from the illuminance distribution formed by the first deflection element 30 and the illuminance distribution formed by the second deflection element 31 comes to form a periodic pattern of an illuminance distribution entering the entrance face 41 of the first fly's eye lens 4, as shown in FIG. 8A. In this case, the illuminance distribution formed on the entrance face 41 of the first fly's eye lens 4 is one with a maximum intensity at positions where the crests of the first deflection element 30 and the crests of the second deflection element 31 are superimposed and with a minimum intensity at positions where the troughs and the troughs of the two elements 30, 31 are superimposed. FIGS. 8A-8D show the illuminance distributions in the case where a beam with a uniform illuminance distribution is incident into the first and second deflection elements 30, 31 and, particularly, FIG. 8B shows a state of beams impinging on the illumination target surface 10.

Since the fly's eye lens system has the function to form the illuminance distributions on the plurality of lens facets (wavefront division facets) in the entrance face 41 of the first fly's eye lens 4 so as to be superimposed on the illumination target surface 10, the angular light intensity distribution of the beam focused at the peripheral region 10p of the illumination target surface 10 is one reflecting illuminance distributions formed in peripheral regions of the respective wavefront division facets arrayed on the entrance face 41 of the first fly's eye lens 4, and the angular light intensity distribution of the beam focused at the central region 10c of the illumination target surface 10 is one reflecting illuminance distributions in central regions of the respective wavefront division facets arrayed on the entrance face 41 of the first fly's eye lens 4.

Light passing through a peripheral region 41cp of a wavefront division facet 41c located in the central region in the Y-direction of the entrance face 41 corresponds to light at small aperture angles in the direction along the axis 11a in the aperture 11, or light at small angles to the optical axis AX or to an axis parallel to the optical axis. Light passing through a peripheral region 41pp of a wavefront division facet located in the wavefront division facet 41p in the Y-direction of the entrance face 41 corresponds to light at large aperture angles in the direction along the axis 11a in the aperture 11. Here, the intensity of the light passing through the peripheral region 41cp of the wavefront division facet 41c is low, while the intensity of the light passing through the peripheral region 41pp of the wavefront division facet 41p is high. Therefore, as shown in FIG. 8C, the light intensity distribution in the aperture 11 in the peripheral region of the illumination target surface 10 is one in which the intensity is low around the origin 11c on the axis 11a and the intensity increases with distance from the origin 11c.

On the other hand, light passing through a central region 41cc of the wavefront division facet 41c in the Y-direction on the entrance face 41 corresponds to light at small aperture angles in the direction along the axis 12a in the aperture 12. Furthermore, light passing through a central region 41pc of the wavefront division facet 41p located in the peripheral region of the entrance face 41 corresponds to a light beam at large aperture angles in the direction along the axis 12a in the aperture 12. Here, the intensity of the light passing through the central region 41cc of the wavefront division facet 41c is high, whereas the intensity of the light passing through the central region 41pc of the wavefront division facet 41p is low. Therefore, as shown in FIG. 8D, the light intensity distribution in the aperture 12 in the central region 10c of the illumination target surface 10 is one in which the intensity is high around the origin 12c on the axis 12a and the intensity decreases with distance from the origin 12c.

Figure 8C:
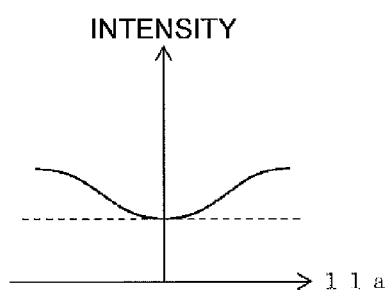
Figure 8D:
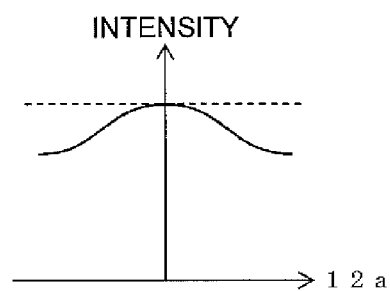

Accordingly, if the illumination apparatus has the difference depending upon positions on the illumination target surface, in angular distribution characteristics of the light intensity distribution shown in FIGS. 8B-8D, the deflection elements 30, 31 can produce characteristics that can cancel out the characteristics, thereby reducing the position-dependent difference of the angular distribution characteristics of the light intensity distribution on the illumination target surface.

These first deflection element 30 and second deflection element 31 may be moved independently of or in conjunction with each other in the direction (Z-direction) along the optical axis AX of the illumination apparatus. Movement of at least one of the first and second deflection elements 30, 31 allows us to adjust the periodic pattern of the illuminance distribution formed by the first and second deflection elements 30, 31.

Figure 9:
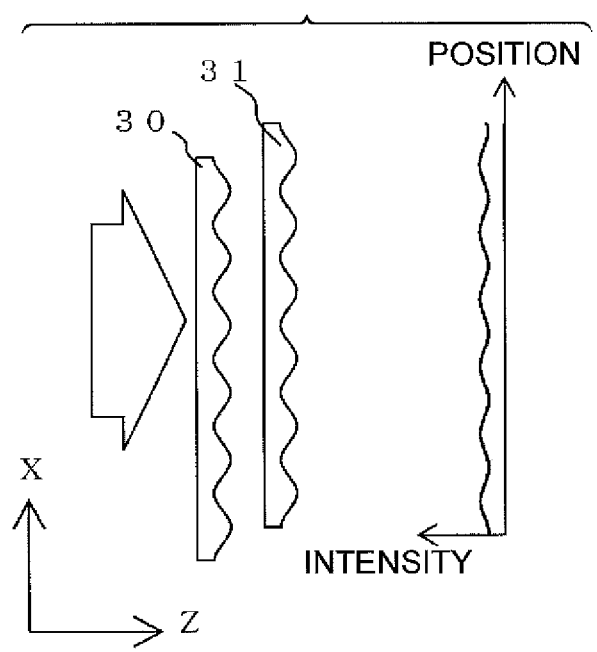
FIG. 9 is a drawing showing the function with a shift of the first and second deflection elements.

FIG. 9 is a drawing showing a positional relation of the deflection elements 30, 31 in the case where the first deflection element 30 or the second deflection element 31 is moved in the X-direction, and an illuminance distribution formed on the exit side by these deflection elements 30, 31. In FIG. 9, the arrow indicates the traveling direction of the light incident into the first and second deflection elements 30, 31. As shown in FIG. 9, the X-directional movement of the first deflection element 30 or the second deflection element 31 increases overlapping ranges where the crests or troughs of the period of the first deflection element 30 overlap the troughs or crests of the period of the second deflection element 31, so as to form the illuminance distribution with the periodic pattern having a smaller difference between intensities at crests and troughs.

In the above description, the first and second deflection elements 30, 31 had the exit faces of the sinusoidal shape having the same period, but the periods of the exit faces of the first and second deflection elements 30, 31 may be different from each other.

Figure 10:
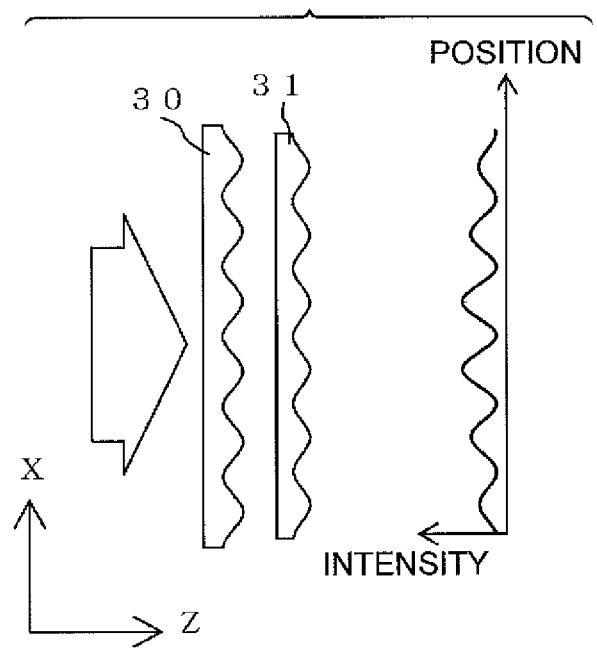
FIG. 10 is a drawing showing the function in a case where the periods of the first and second deflection elements are different from each other.

FIG. 10 is a drawing showing a positional relation of the deflection elements 30, 31 in the case where the period of the first deflection element 30 and the period of the second deflection element 31 are different from each other, and an illuminance distribution formed on the exit side by these deflection elements 30, 31. In FIG. 10, the arrow also indicates the traveling direction of the light incident into the first and second deflection elements 30, 31.

In the example of FIG. 10, the first deflection element 30 has the period slightly larger than that of the second deflection element 31, and the crests of the first deflection element 30 are arranged so as to overlap the crests of the second deflection element 31 in their central regions in the X-direction. In this case, the intensity is the highest at a position where the crest of the first deflection element 30 overlaps the crest of the second deflection element 31 around their centers in the X-direction, and the overlapping range of their crests decreases from the central regions to the peripheral regions of the first deflection element 30 and the second deflection element 31, so as to lower the intensity.

The intensity is the lowest at positions where troughs of the first deflection element 30 overlap troughs of the second deflection element 31 near the centers of the first deflection element 30 and the second deflection element 31 in the X-direction and the overlapping range of their troughs decreases from the central regions to the peripheral regions of the first deflection element 30 and the second deflection element 31, so as to raise the intensity. For this reason, the periodic pattern of the illuminance distribution formed by the first deflection element 30 and the second deflection element 31 shown in FIG. 10 includes a plurality of crests and troughs in one period in the X-direction.

Figure 11A:
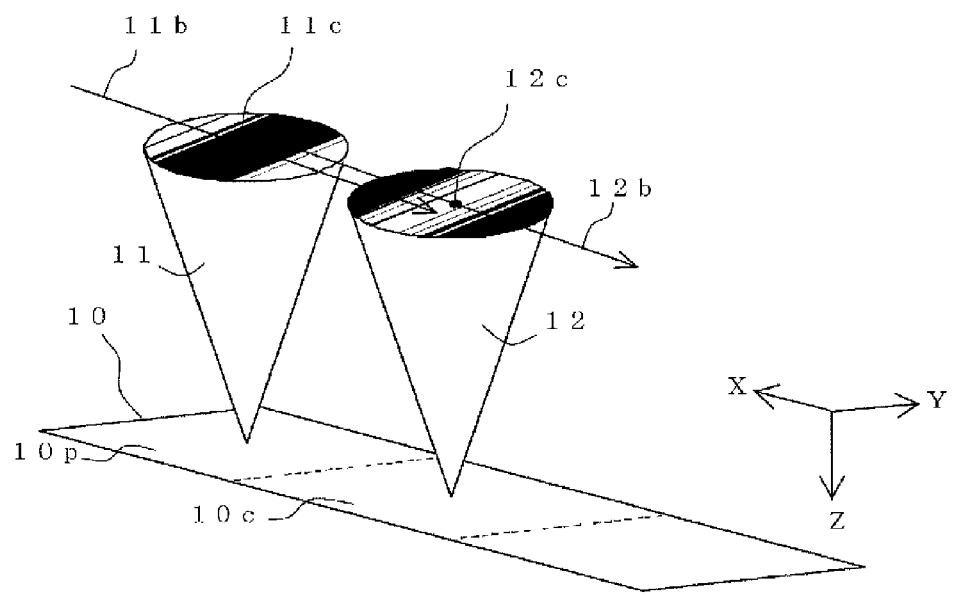
FIGS. 11A to 11C are drawings showing illuminance distributions of beams impinging on the illumination target surface in the case of FIG. 10.
Figure 11B:
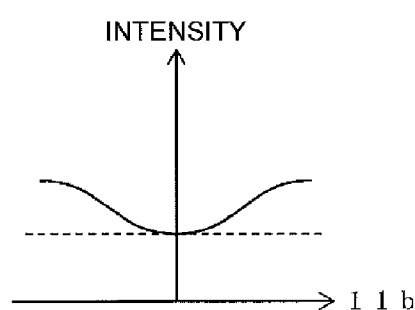
Figure 11C:
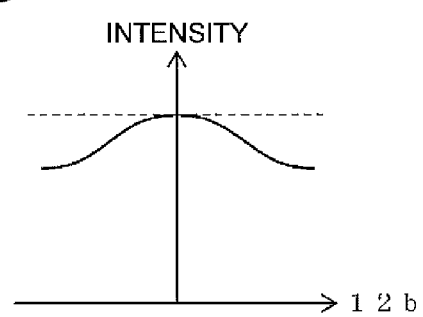

FIGS. 11A-11C show a state of beams impinging on the illumination target surface 10, in the case where the positional relation of the first and second deflection elements 30, 31 is in the state shown in FIG. 10. FIG. 11A herein shows the state of beams impinging on the illumination target surface 10, in the case where light with a uniform illuminance distribution is incident into the first and second deflection elements 30, 31. In FIG. 11A, the central region 10c of the illumination target surface 10 and the peripheral region 10p thereof in the X-direction are separated by a dotted line along the Y-direction. When the origin 11c is defined at the center in the aperture of the beam 11 focused at the peripheral region 10p on the illumination target surface 10, the light intensity distribution along the axis 11b extending in the X-direction while passing this origin 11c is shown in FIG. 11B; when the origin 12c is defined at the center in the aperture of the beam 12 focused at the central region 10c on the illumination target surface 10, the light intensity distribution along the axis 12b extending in the X-direction while passing this origin 12c is shown in FIG. 11C.

In the illuminance distributions shown in FIGS. 11B and 11C, the vertical axis represents the light intensity and the horizontal axis coordinates along each axis 11b, 12b. These light intensity distributions shown in FIGS. 11B and 11C correspond respectively to a light intensity distribution in angular directions with respect to the reference axis connecting the origin 11c and the focused point, of the beam 11 focused at the peripheral region 10p of the illumination target surface 10 and to a light intensity distribution in angular directions with respect to the reference axis connecting the origin 12c and the focused point, of the beam 12 focused at the central region 10c of the illumination target surface 10.

Since the first and second deflection elements 30, 31 form the illuminance distribution shown in FIG. 10 on the exit side, the light intensity distribution in the aperture 11 in the peripheral region 10p of the illumination target surface 10 is one in which the intensity is low around the origin 11c on the axis 11b and the intensity increases with distance from the origin 11c, as shown in FIG. 11B.

On the other hand, the light intensity distribution in the aperture 12 in the central region 10c of the illumination target surface 10 is one in which the intensity is high around the origin 12c on the axis 12b and the intensity decreases with distance from the origin 12c, as shown in FIG. 11C.

Therefore, in the case where the illumination apparatus has the difference depending upon X-directional positions, in angular distribution characteristics of the light intensity distribution on the illumination target surface, the illumination apparatus can also reduce the difference.

Other modification examples of the deflection member 3 will be described below.

The first modification example may be a configuration wherein the deflection member 3 is configured to rotate about an axis at a predetermined angle.

The predetermined angle herein is an angle between the optical axis AX of the illumination apparatus and an axis of rotation of the deflection member 3. It is, however, noted that the predetermined angle embraces 0° and thus the optical axis AX of the illumination apparatus may be parallel to the axis of rotation of the deflection member 3 as shown in FIG. 6.

The second modification example may be a configuration wherein the deflection member 3 is configured to rotate about an axis not intersecting with the optical axis AX of the illumination apparatus. It is noted herein that the axis not intersecting with the optical axis AX of the illumination apparatus may be parallel to the optical axis AX or may make a predetermined angle therewith. In Modification 2, the deflection member 3 can be obliquely inclined relative to the fly's eye lens system 45.

Modification 1 and Modification 2 may be adapted for the first and second deflection elements 30, 31.

The third modification example may be a configuration wherein the deflection member 3 includes a plurality of deflection elements having the same period in the direction along the entrance face or the exit face of the deflection element and deflection elements having different periods in the direction along the entrance face or the exit face of the deflection element. For example, in a configuration wherein the deflection member 3 includes four deflection elements (first to fourth deflection elements), the first and second deflection elements may have the same period, the third deflection element the period different from that of the first and second deflection elements, and the fourth deflection element the period different from those of the first to third deflection elements.

The fourth modification example may be a configuration wherein the deflection member 3 includes deflection elements to form illuminance distributions with the same periodic pattern and deflection elements to form illuminance distributions with different periodic patterns, all together. For example, in a configuration wherein the deflection member 3 includes four deflection elements (first to fourth deflection elements), the first and second deflection elements may be deflection elements to form the illuminance distributions with the same periodic pattern, the third deflection element a deflection element to form the illuminance distribution with the periodic pattern different from that of the first and second deflection elements, and the fourth deflection element a deflection element to form the illuminance distribution with the periodic pattern different from those of the first to third deflection elements.

The fifth modification example may be a configuration wherein the illumination apparatus is configured to correct at least one of differences depending upon positions (XY coordinate positions) on the illumination target surface, in illuminance distributions in two directions (XY directions) on the illumination target surface and angular light intensity distributions of beams reaching the illumination target surface. For example, in a configuration wherein the deflection member 3 includes four deflection elements (first to fourth deflection elements), the first and second deflection elements may be deflection elements to form an illuminance distribution with a periodic pattern along the X-direction, and the third and fourth deflection elements deflection elements to form an illuminance distribution with a periodic pattern along the Y-direction. These deflection elements may be arranged so as to be rotatable about the optical axis of the illumination optical system or about an axis parallel to this optical axis.

In the above-described first and second embodiments and first to fourth modification examples, with concern about application to scanning projection exposure apparatus to perform exposure while moving a reticle and a wafer in synchronism along a scanning direction (Y-direction), correction is made for the difference depending upon positions in a non-scanning direction (X-direction), in the illuminance distribution in the non-scanning direction or the angular light intensity distributions of the beams reaching the illumination target surface.

However, an averaging effect in the scanning direction cannot be utilized in application to full-shot exposure type projection exposure apparatus to perform exposure with the reticle and wafer at rest, and the fifth modification example is useful in that case.

The above first and second embodiments and first to fifth modification examples may be used in any combination.

Each of the deflection elements is adjustable in position and they may be operated in conjunction with or independently of each other.

By changing the position of each deflection element, the angular light intensity distribution of the beam focused at any position on the illumination target surface can be changed to an optional distribution.

The above first and second embodiments and first to fifth modification examples described the optical system making use of refraction but the deflection member making use of reflection or diffraction may be applied, for example, to cases where the wavelength of used light is in the ultraviolet region and the deflection member can cause a loss in light quantity.

Figure 12:
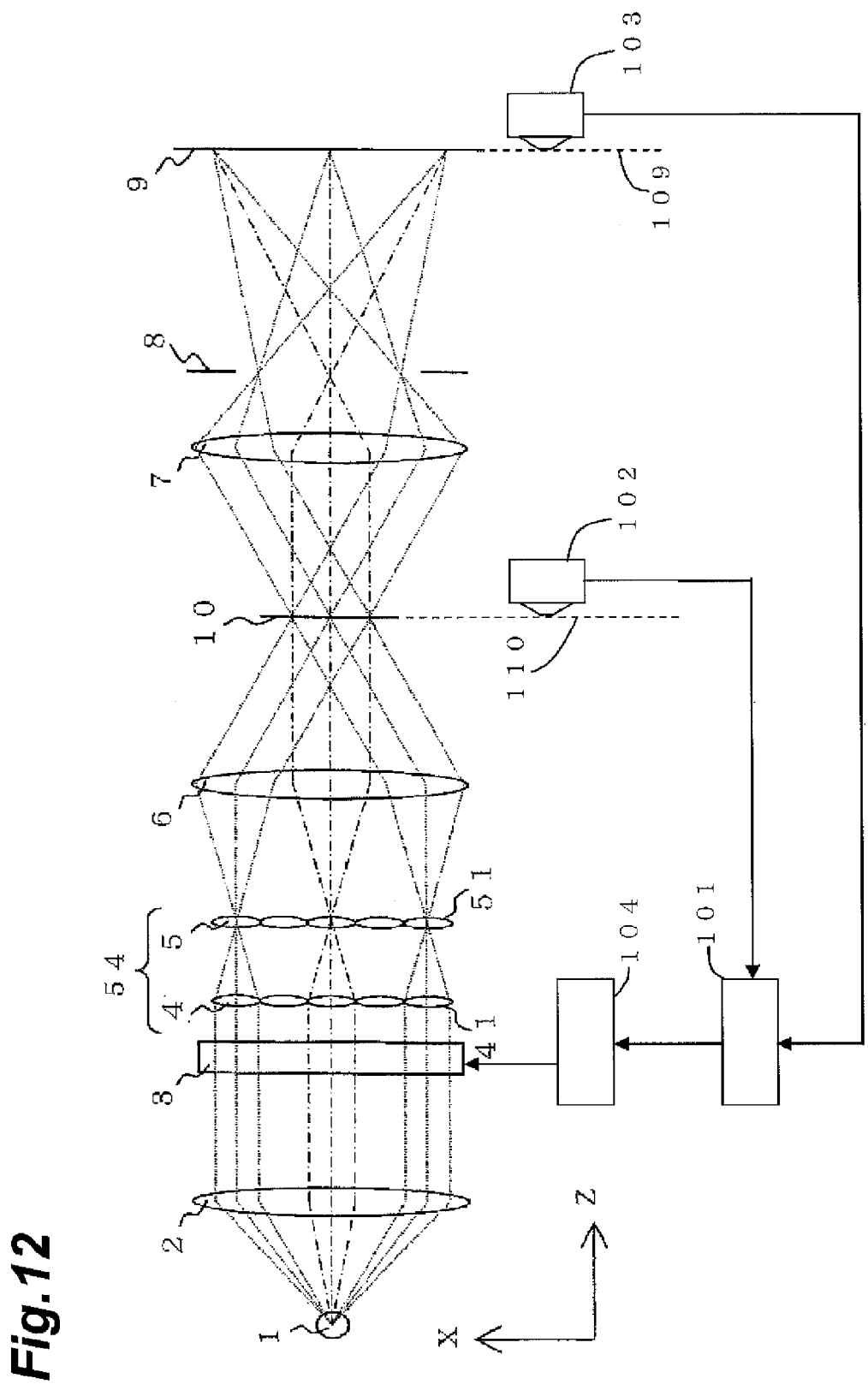
FIG. 12 is a drawing showing a projection exposure device equipped with an illumination apparatus according to a modification example.

As shown in FIG. 12, a projection exposure apparatus may be provided with a measuring device 102 for measuring the illuminance distribution on the illumination target surface 10 or the angular distribution characteristics of the light intensity distribution on the illumination target surface 10, and with a measuring device 103 for measuring the illuminance distribution on the projection target surface 9 or the angular distribution characteristics of the light intensity distribution on the projection target surface 9, and configured to change the periodic pattern of the illuminance distribution formed by the deflection member 3, based on the measurement results of these measuring devices. In the example of FIG. 12, members with the same functionality as those shown in the foregoing FIGS. 1, and 2A-3C are denoted by the same reference signs.

Here, the measuring device 102 is arranged so as to be movable along an extension surface 110 of the illumination target surface 10 and is inserted into the illumination optical path in measuring the illuminance distribution on the illumination target surface 10 or the angular distribution characteristics of the light intensity distribution on the illumination target surface 10.

Furthermore, the measuring device 103 is arranged so as to be movable along an extension surface 109 of the projection target surface 9 and is inserted into the image field of the projection optical system 7 in measuring the illuminance distribution on the projection target surface 9 or the angular distribution characteristics of the light intensity distribution on the projection target surface 9.

Outputs from these measuring devices 102, 103 are fed to a control unit 101. The control unit 101 determines the position of the deflection member 3 for setting the illuminance distribution on the illumination target surface 10 or the angular distribution characteristics of the light intensity distribution on the illumination target surface 10 to a desired distribution and for setting the illuminance distribution on the projection target surface 9 or the angular distribution characteristics of the light intensity distribution on the projection target surface 9 to a desired distribution, and outputs such a control signal as to move the deflection member to the determined position, to a drive unit 104.

The drive unit 104 changes the position of the deflection member 3 on the basis of the control signal from the control unit 101.

This configuration allows the illuminance distribution on the illumination target surface 10, the angular light intensity distribution of the beam focused at any position on the illumination target surface 10, the illuminance distribution on the projection target surface 9, or the angular light intensity distribution of the beam focused at any position on the projection target surface 9 to be changed to an optional distribution.

The example of FIG. 12 described the example of the configuration with the single deflection member 3 as in the foregoing first embodiment and first and second modification examples, and in the case of the configuration with a plurality of deflection elements as in the foregoing second embodiment and third to fifth modification examples, the control unit 101 may be configured to determine the positions of the respective deflection elements for setting the illuminance distribution on the illumination target surface 10 or the angular distribution characteristics of the light intensity distribution on the illumination target surface 10 to a desired distribution and for setting the illuminance distribution on the projection target surface 9 or the angular distribution characteristics of the light intensity distribution on the projection target surface 9 to a desired distribution. At this time, the drive unit 104 changes the positions of the respective deflection elements, based on the control signal output.

In each of the foregoing embodiments and each of the foregoing modification examples, the deflection member had the refracting surface of the sinusoidal shape, but a refracting surface of a curved shape being concave and convex in one direction may be applied instead of the refracting surface of the sinusoidal shape. For example, we can apply a refracting surface in a form in which concave cylindrical faces and convex cylindrical faces are alternately arranged in one direction or a refracting surface in a form in which these cylindrical faces are replaced by faces with cross sections in the foregoing one direction being conic.

In each of the foregoing embodiments and each of the foregoing modification examples, the deflection member had the form in which the entrance face was the flat face and the exit face was of the concave and convex curved shape, but it may have a form in which the entrance face has the concave and convex curved shape and the exit face is flat, or a form in which both of the entrance face and the exit face have the concave and convex curved shape. The entrance face or the exit face does not have to be a flat face but may be a spherical face or an aspherical face such as a cylindrical face. Furthermore, the concave and convex curved shape of the deflection member does not have to be limited to the case where a surface connecting inflection points is a plane, but may be one in which the surface connecting inflection points of the concave and convex curved shape is a spherical surface or an aspherical surface such as a cylindrical surface.

In each of the foregoing embodiments and each of the foregoing modification examples, the light source to be used can be a laser light source, e.g., an ArF excimer laser light source to supply light at the wavelength of 193 nm or a KrF excimer laser light source to supply light at the wavelength of 248 nm. When such a laser light source to supply a nearly parallel beam is used, the collimator lens 2 may be omitted. Furthermore, a beam expander system or an afocal system may be used instead of the collimator lens 2.

The light source to be used may be a solid-state light source such as LD or LED to supply light in the near-ultraviolet wavelength range or in the ultraviolet wavelength range, or an ultrahigh pressure discharge lamp such as a mercury lamp.

In each of the foregoing embodiments and each of the foregoing modification examples, a rod lens (internal reflection type integrator) may be used instead of the fly's eye lens as optical integrator. In this case, the system can be arranged so that a condensing optical system having a front focal point at the position where the deflection member 3 is located and a rear focal point at or near the entrance face of the rod lens is placed between the rod lens and the deflection member.

In each of the foregoing embodiments and each of the foregoing modification examples, the description was given using the example of normal illumination using the secondary light sources with the whole luminance distribution of the circular shape, but the present invention can also be applied to modified illumination cases using the secondary light sources with the luminance distribution of an annular shape or a multi-pole shape.

In such modified illumination cases, the device may be arranged so that a spatial light modulator such as a diffraction optical element or an active mirror array to generate the light intensity distribution of the annular shape or the multi-pole shape in its far field is arranged in the light-source-side optical path of the deflection member 3 and so that an optical system (Fourier transform optical system) to focus the light intensity distribution generated in the far field by the spatial light modulator, near the deflection member is arranged in the optical path on the deflection member side of the spatial light modulator.

In the foregoing embodiments and modification examples, it is also possible to apply the so-called polarized illumination method as disclosed in U.S. Pat. No. 7,423,731, and U.S. Published Patent Applications No. 2006/0170901 and No. 2007/0146676.

In the foregoing embodiments and modification examples, the so-called liquid immersion method may be applied which is a technique of filling the inside of the optical path between the projection optical system and the photosensitive substrate with a medium (typically, a liquid) having the refractive index larger than 1.1.

The exposure device of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling process: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure device include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure device. After completion of the assembling steps from the various sub-systems into the exposure device, overall adjustment is carried out to ensure various accuracies as the entire exposure device. The manufacture of the exposure device may be performed in a clean room in which the temperature, cleanliness, etc. are controlled.

Figure 13:
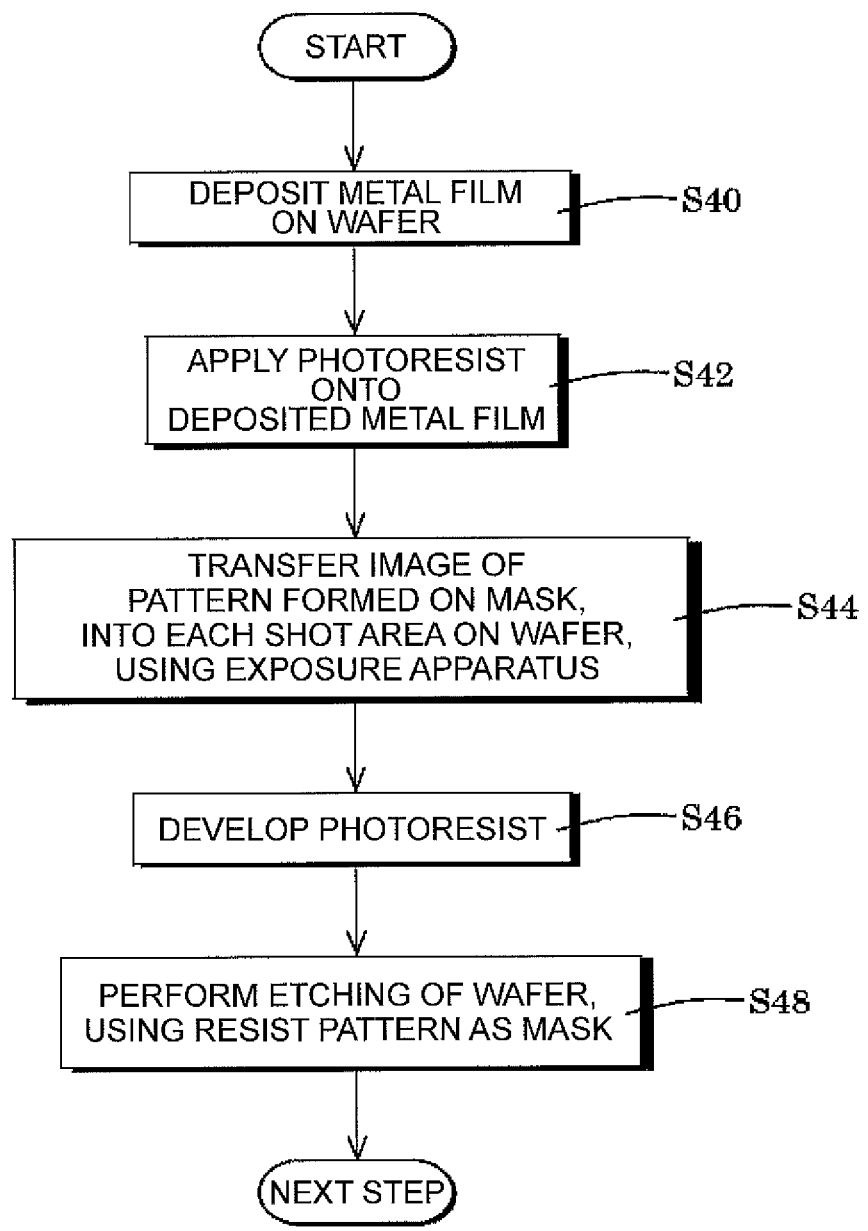
FIG. 13 is a flowchart showing steps of manufacturing semiconductor devices.

The following will describe a device manufacturing method using the exposure device according to the above-described embodiment. FIG. 13 is a flowchart showing steps of manufacturing semiconductor devices. As shown in FIG. 13, the manufacturing steps of semiconductor devices include depositing a metal film on a wafer W to become a substrate of semiconductor devices (step S40) and applying a photoresist as a photosensitive material onto the deposited metal film (step S42). The subsequent steps include transferring a pattern formed on a mask (reticle) M, into each shot area on the wafer W, using the projection exposure device of the aforementioned embodiment (step S44: exposure step), and developing the wafer W after completion of the transfer, i.e., developing the photoresist onto which the pattern has been transferred (step S46: development step).

Thereafter, using the resist pattern made on the surface of the wafer W in step S46, as a mask, processing such as etching is carried out on the surface of the wafer W (step S48: processing step). The resist pattern herein is a photoresist layer in which depressions and projections are formed in a shape corresponding to the pattern transferred by the projection exposure device of the above embodiment and through which the depressions penetrate. Step S48 is to process the surface of the wafer W through this resist pattern. The processing carried out in step S48 includes, for example, at least either etching of the surface of the wafer W or deposition of a metal film or the like thereon. In step S44, the projection exposure device of the above embodiment performs the transfer of the pattern onto the wafer W coated with the photoresist, as a photosensitive substrate or plate P.

Figure 14:
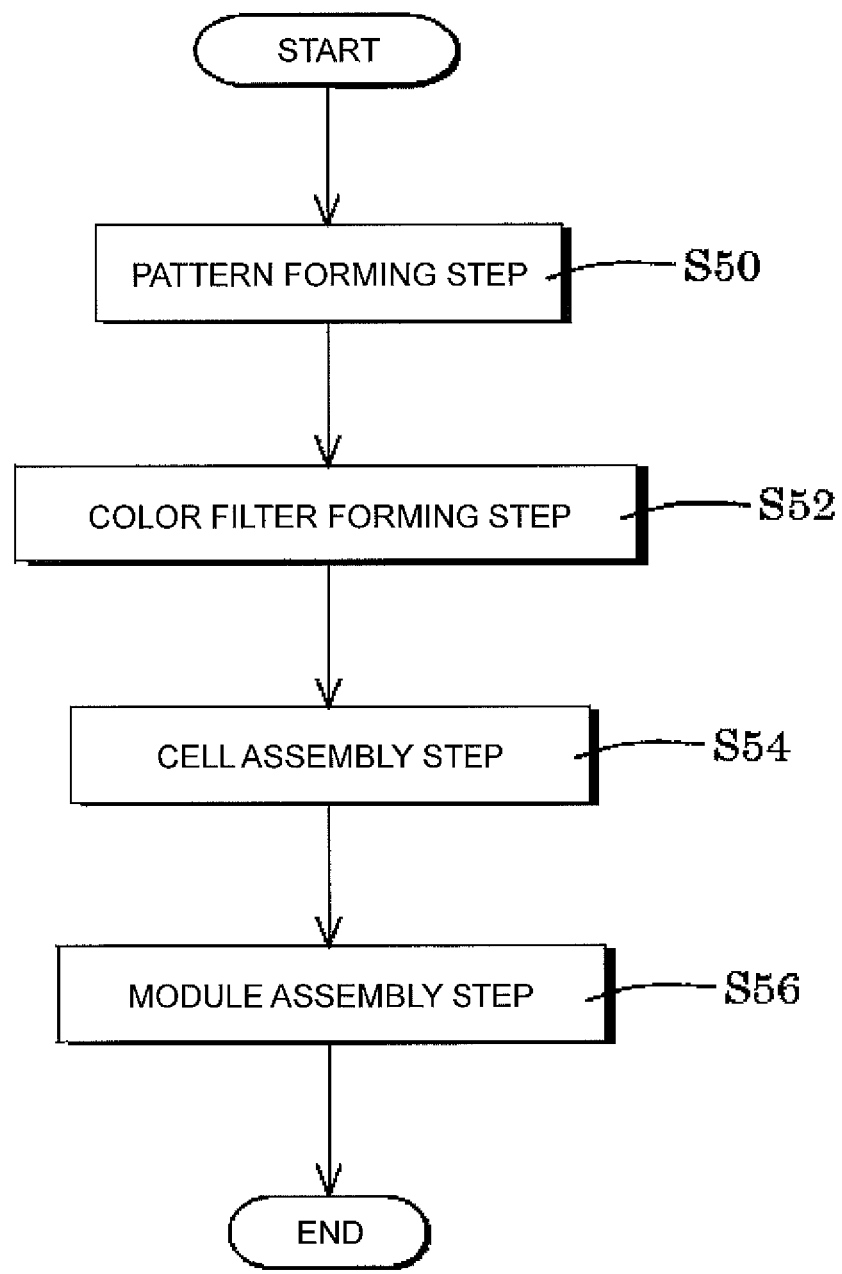
FIG. 14 is a flowchart showing steps of manufacturing a liquid crystal device such as a liquid crystal display device.

FIG. 14 is a flowchart showing steps of manufacturing a liquid crystal device such as a liquid crystal display device. As shown in FIG. 14, the manufacturing steps of the liquid crystal device include sequentially performing a pattern forming step (step S50), a color filter forming step (step S52), a cell assembly step (step S54), and a module assembly step (step S56). The pattern forming step of step S50 is to form predetermined patterns such as a circuit pattern and an electrode pattern on a glass substrate coated with a photoresist, as a plate P, using the projection exposure device of the aforementioned embodiment. This pattern forming step includes an exposure step of transferring a pattern to a photoresist layer, using the projection exposure device of the above embodiment, a development step of performing development of the plate P onto which the pattern has been transferred, i.e., development of the photoresist layer on the glass substrate, to form the photoresist layer in the shape corresponding to the pattern, and a processing step of processing the surface of the glass substrate through the developed photoresist layer.

The color filter forming step of step S52 is to form a color filter in which a large number of sets of three dots corresponding to R (Red), G (Green), and B (Blue) are arrayed in a matrix pattern, or in which a plurality of filter sets of three stripes of R, and B are arrayed in a horizontal scan direction. The cell assembly step of step S54 is to assemble a liquid crystal panel (liquid crystal cell), using the glass substrate on which the predetermined pattern has been formed in step S50, and the color filter formed in step S52. Specifically, for example, a liquid crystal is poured into between the glass substrate and the color filter to form the liquid crystal panel. The module assembly step of step S56 is to attach various components such as electric circuits and backlights for display operation of this liquid crystal panel, to the liquid crystal panel assembled in step S54.

The present embodiment is not limited just to the application to the exposure apparatus for manufacture of semiconductor devices, but can also be widely applied, for example, to the exposure apparatus for the liquid crystal display devices formed with rectangular glass plates, or for display devices such as plasma displays, and to the exposure apparatus for manufacture of various devices such as imaging devices (CCDs and others), micromachines, thin-film magnetic heads, and DNA chips. Furthermore, the present embodiment is also applicable to the exposure step (exposure apparatus) for manufacture of masks (photomasks, reticles, etc.) on which mask patterns of various devices are formed, by the photolithography process.

In the aforementioned embodiments and modification examples, the present embodiment was applied to the illumination optical system for illuminating the mask in the exposure device, but, without having to be limited to this, the present embodiment can also be applied to a general illumination optical system for illuminating the illumination target surface except for the mask.

It is noted that the above-described embodiments are by no means intended to limit the scope of each claim. Therefore, many changes and corrections can be made in the configurations in the above embodiments. Furthermore, it is intended that the embodiments described in the scope of claims embrace not only the modes disclosed in the above embodiments but also equivalents and other corrections and changes obvious to those skilled in the art.

REFERENCE SIGNS LIST 1 light source
2 collimator lens
3, 30, 31 deflection member
4, 5 fly's eye lenses
6 condenser lens
7 projection lens
8 aperture stop
9 projection target surface
10 illumination target surface
41 entrance face
51 exit face
54 fly's eye lens system

The invention claimed is:

1. An illumination optical system configured to illuminate an illumination target surface with light from a light source, comprising:
   a first deflector which is arranged on a first face crossing an optical path of the light from the light source and has a structure with a period in a first direction, the first direction defined on the first face;
   a second deflector which is arranged on a second face crossing an optical path of light from the first deflector and has a structure with a period in a second direction, the second direction defined on the second face;
   an optical integrator which has a plurality of wavefront division facets arrayed on a third face, the third face crossing an optical axis of light from the second deflector; and
   a rotation driver which rotates at least one of the first deflector and the second deflector,
   wherein at least one of the first and second deflectors rotates about an optical axis of the illumination optical system or about an axis parallel to the optical axis in order to adjust a pattern of an illumination distribution.

2. The illumination optical system according to claim 1, wherein
   the periods of the first and second deflectors are different from each other.

3. The illumination optical system according to claim 1, wherein
   the periods of the first and second deflectors are equal to each other.

4. The illumination optical system according to claim 1, wherein
   the light from the second deflector has an illumination distribution which periodically changes on the third face.

5. The illumination optical system according to claim 4, wherein
   the illumination distribution changes by rotation of at least one of the first deflector and the second deflector.

6. The illumination optical system according to claim 1, wherein
   at least one of the first deflector and the second deflector moves in a direction crossing the optical axis.

7. The illumination optical system according to claim 1, wherein
   the rotation driver rotates at least one of the first deflector and the second deflector so as to change a difference depending upon positions on the illumination target surface, in an angular distribution of light intensity within an aperture of light focused on the illumination target surface.

8. An exposure apparatus comprising:
the illumination optical system as set forth in claim 1 which illuminates a master disposed on the illumination target surface; and
a projection optical system which projects the master onto a photosensitive substrate.

9. The exposure apparatus according to claim 8, wherein the rotation driver rotates at least one of the first deflector and the second deflector so as to change a difference depending upon the master, in an angular distribution of light intensity within an aperture of light focused on the master.

10. An illumination method for illuminating an illumination target surface with light from a light source, comprising:
letting the light from the light source enter a first deflector which has a structure with a period in a first direction, the first direction defined on a first face, the first face crossing an optical path of the light from the light source;
letting light from the first deflector enter a second deflector which has a structure with a period in a second direction, the second direction defined on a second face, the second face crossing an optical path of the light from the first deflector;
letting light from the second deflector enter a plurality of wavefront division facets arrayed on a third face, the third face crossing an optical axis of the light from the second deflector;
rotating at least one of the first deflector and the second deflector by a rotation driver in order to adjust a pattern of an illumination distribution; and
illuminating the illumination target surface, using light via the wavefront division facets.

11. An exposure method comprising:
illuminating a master disposed on the illumination target surface, using the illumination method as set forth in claim 10; and
projecting the master onto a photosensitive substrate.

12. A device manufacturing method comprising:
performing exposure to transfer an exposure pattern onto the photosensitive substrate, using the exposure method as set forth in claim 11;
developing the photosensitive substrate onto which the exposure pattern has been transferred, to form a mask layer in a shape corresponding to the exposure pattern on a surface of the photosensitive substrate; and
processing the surface of the photosensitive substrate through the mask layer.

\* \* \* \* \*